US010573227B2

United States Patent
Gu et al.

(10) Patent No.: US 10,573,227 B2
(45) Date of Patent: Feb. 25, 2020

(54) LED DISPLAY UNIT GROUP AND DISPLAY PANEL

(71) Applicant: FOSHAN NATIONSTAR OPTOELECTRONICS CO., LTD., Foshan (CN)

(72) Inventors: Feng Gu, Foshan (CN); Chuanbiao Liu, Foshan (CN); Kuai Qin, Foshan (CN); Xi Zheng, Foshan (CN); Yuanbin Lin, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 18 days.

(21) Appl. No.: 15/995,248

(22) Filed: Jun. 1, 2018

(65) Prior Publication Data
US 2019/0355294 A1  Nov. 21, 2019

(30) Foreign Application Priority Data
May 21, 2018  (CN) .......................... 2018 1 0490554

(51) Int. Cl.
*G09G 3/32* (2016.01)
*G09G 3/34* (2006.01)

(52) U.S. Cl.
CPC ............. *G09G 3/32* (2013.01); *G09G 3/3426* (2013.01); *G02F 2201/123* (2013.01); *G09G 2310/0264* (2013.01)

(58) Field of Classification Search
None
See application file for complete search history.

(56) References Cited

U.S. PATENT DOCUMENTS

| 2015/0294959 | A1  | 10/2015 | Lee et al. |          |
|--------------|-----|---------|------------|----------|
| 2017/0009971 | A1* | 1/2017  | Chan       | H01L 25/0753 |
| 2018/0190184 | A1* | 7/2018  | Kim        | G09G 3/32 |

FOREIGN PATENT DOCUMENTS

| CN | 102945845 A   | 2/2013 |
| JP | 2006049551 A  | 2/2006 |
| JP | 2016512344 A  | 6/2016 |
| JP | 3214514 U     | 1/2018 |
| JP | 6289718 B1    | 3/2018 |

* cited by examiner

*Primary Examiner* — Christopher J Kohlman
(74) *Attorney, Agent, or Firm* — Bond Schoeneck & King, PLLC; George McGuire (57) ABSTRACT

The disclosure provides an LED display unit group and display panel, including a pixel unit array of n rows and m columns of pixel units. n and m are positive integers not less than 2. Each pixel unit includes a first, a second and a third LED chip. In the i-th row, the A-electrodes of all the LED chips in m pixel units are connected together, and are electrically connected to the i-th common A-electrode pin. In the j-th column, the B-electrodes of n first LED chips are connected together and are electrically connected to the j-th first B-electrode pin, the B-electrodes of n second LED chips are connected together and electrically connected to the j-th second B-electrode pin, and the B-electrodes of n third LED chips are connected together and are electrically connected to j-th third B-electrode pin of the LED display unit group.

18 Claims, 7 Drawing Sheets

LED DISPLAY UNIT GROUP AND DISPLAY PANEL

CROSS-REFERENCE TO RELATED APPLICATIONS

This application claims priority to Chinese Patent Application No. CN201810490554.2, filed on May 21, 2018 and entitled "LED DISPLAY UNIT GROUP AND DISPLAY PANEL", the disclosure of which is incorporated herein by reference in its entirety.

TECHNICAL FIELD

Embodiments of the present disclosure relate to LED display technologies, in particular to an LED display unit group and a display panel.

BACKGROUND

LED display screens are widely used in various fields such as industry, transportation, commercial advertising, and information publication due to their advantages such as high gray scales, large viewing angles, low power consumptions, and customizable screen shapes.

Figure 1:
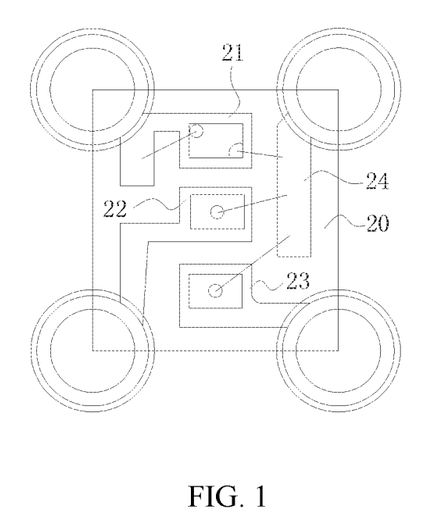
FIG. 1 is a front wiring diagram of a light-emitting unit in a prior art.
Figure 2:
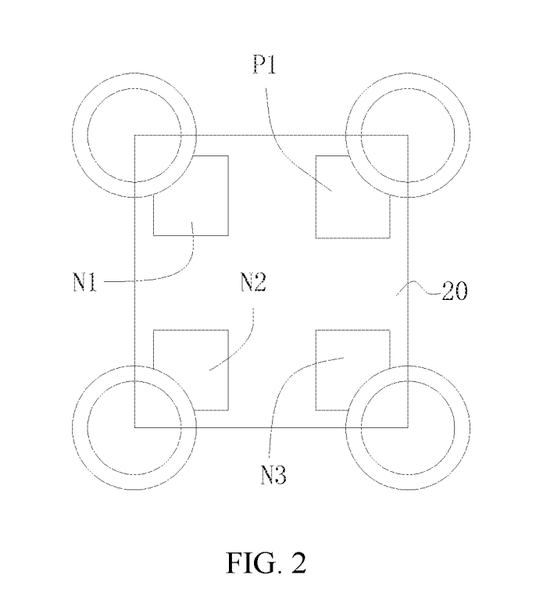
FIG. 2 is a rear wiring diagram of the light-emitting unit in FIG. 1.

The LED display screen is composed of a plurality of independent LED light-emitting units arranged in an array. FIG. 1 is a front wiring diagram of a light-emitting unit in a prior art, and FIG. 2 is a back wiring diagram of the light-emitting unit in FIG. 1. Referring to FIG. 1 and FIG. 2, each of light-emitting units includes an insulating substrate 20, four metal pads, one anode pin, three cathode pins, and LED chips having three colors of red, green, and blue. Three LED chips are respectively fixed on a first chip bonding pad 21, a second chip bonding pad 22, and a third chip bonding pad 23. Anodes of the three LED chips are connected to the common anode pad 24, and are connected to the anode pin P1 on the back of the insulating substrate 20 through metal vias. Cathodes of the three LED chips are connected to respective cathode pads, and are connected to respective cathode pins. In FIG. 1, the LED chips on the second chip bonding pad 22 and the third chip bonding pad 23 are vertical chips, and the cathode is fixed on the second chip bonding pad 22 and the third chip bonding pad 23 through conductive adhesive, wherein the second chip bonding pads 22 and the third chip bonding pad 23 both serve as the cathode pads of the two chips thereon, and a portion of the first bonding pad 21 serves as the cathode pad of the chip thereon, and the three cathode pads are respectively connected to the three cathode pins on the back of the insulating substrate through the metal vias. The three LED chips and the pads are covered by a transparent encapsulating material. When forming a display module, it is necessary to weld the pins of the plurality of independent LED light-emitting units onto a print circuit board (PCB). With the rapid development of LED display screen towards downsizing, the size of the corresponding light-emitting units also tends to be reduced. However, the conventional independent light-emitting unit has the problem that the welding operation is difficult and is easy to be sealing-off, and hence it is not favorable to transportation. Besides, the volume of the encapsulating material in the light-emitting unit is small, resulting in weak bonding force between the encapsulating material and the insulating substrate, poor sealing performance, and weak moisture resistance.

SUMMARY

Embodiments of the disclosure provide an LED display unit group and a display panel, so as to improve the operability and reliability on welding for the pins, and improve the sealing performance of the LED display unit group.

In a first aspect, embodiments of the present disclosure provides an LED display unit group, including a pixel unit array consisting of n rows and m columns of pixel units. Both n and m are positive integers greater than or equal to 2.

Each of the pixel units includes three LED chips having different light-emitting colors, which are respectively a first LED chip, a second LED chip and a third LED chip; and each of the LED chips includes an A-electrode and a B-electrode. Polarities of the A-electrode and B-electrode are opposite to each other;

In the i-th row of pixel units, the A-electrodes of all the LED chips in m pixel units are connected together, and are electrically connected to the i-th common A-electrode pin of the LED display unit group.

In the j-th column of pixel units, the B-electrodes of n first LED chips are connected together, and are electrically connected to the j-th first B-electrode pin of the LED display unit group;

the B-electrodes of n second LED chips are connected together, and are electrically connected to the j-th second B-electrode pin of the LED display unit group; and the B-electrodes of n third LED chips are connected together, and are electrically connected to j-th third B-electrode pin of the LED display unit group.

1≤i≤n, 1≤j≤m, and i, j are both integers.

In a second aspect, embodiments of the present disclosure provide a display panel including an LED display unit group in the first aspect.

With the LED display unit group according to the first embodiment of the present disclosure, n×m pixel units are encapsulated together to form a display unit group, thereby increasing the volume of the single display unit group and facilitating the welding operation; in addition, in a display unit group, the volume of the encapsulating material is increased, resulting in the more reliable bonding between the material and the insulating substrate, thereby improving the sealing performance; besides, with the above circuit structure, a larger number of pins can be provided in a single display unit, resulting in the increased number of welding points contacting with the PCB, thereby improving the reliability of welding.

DETAILED DESCRIPTION

The present disclosure will be further described in detail below with reference to the accompanying drawings and embodiments. It can be understood that the specific embodiments described herein are only used to explain the present disclosure but not to limit the present disclosure. It should also be noted that for ease of description, only a part of structures related to the present disclosure but not all of the structures are shown in the drawings.

First Embodiment

Figure 3:
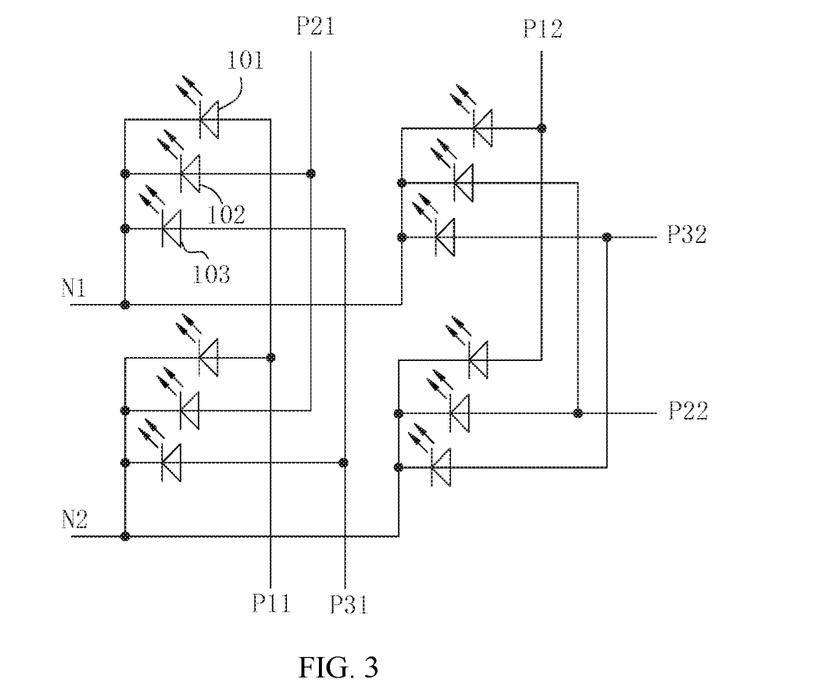
FIG. 3 is a schematic diagram of an internal circuit structure of an LED display unit group according to a first embodiment of the present disclosure.

A first embodiment of the present disclosure provides an LED display unit group. FIG. 3 is a schematic diagram of an internal circuit structure of an LED display unit group according to first embodiment of the present disclosure. Referring to FIG. 3, the LED display unit group includes a pixel unit array consisting of n rows and m columns of pixel units, wherein both n and m are positive integers greater than or equal to 2.

Each pixel unit includes three LED chips having different light-emitting colors, which are a first LED chip 101, a second LED chip 102, and a third LED chip 103, respectively. The LED chip includes an A-electrode and a B-electrode. Polarities of the A-electrode and the B-electrode are opposite to each other. In this embodiment, to describe the present disclosure, the A-electrode is a cathode of the LED chip and the B-electrode is an anode of the LED chip, for example.

In the i-th row, the cathodes of all the LED chips in the m pixel units are connected together and are electrically connected to the i-th common cathode pin Ni of the LED display unit group.

In the j-th column, the anodes of the n first LED chips 101 are connected together and are electrically connected to the j-th first anode pin P1j of the LED display unit group. The anodes of the n second LED chips 102 are connected together, and are electrically connected to the j-th second anode pin P2j of the LED display unit group. The anodes of the n third LED chips 103 are connected together and are electrically connected to the j-th third anode pin P3j of the LED display unit group.

1≤i≤n, 1≤j≤m, and both i, j are integers.

With the above circuit structure, n+3m pins of the LED display unit group including n cathode pins and 3m anode pins are formed, such that a larger number of pins can be provided in a single display unit. For example, if n=2 and m=2, then the number of pins of the LED display unit group is eight. In this way, the number of pins is doubled compared with the display unit formed by a single pixel unit, thereby doubling the number of welding points contacting with the PCB when forming an LED display module, so that the welding reliability is improved. Under the given area of the LED module, the number of welding points on the PCB is half reduced, thereby saving half of metal traces on the PCB, and simplifying the production process of the PCB. In addition, with such the structure, the formed volume is approximately 4 times that of the display unit formed by a single pixel unit, thereby improving the operability in welding; and also, the used encapsulating material is at least 4 times that of the display unit formed by a single pixel unit, thereby improving the contact area between the encapsulating material and the insulating substrate, so that the encapsulating material and the insulating substrate can be more reliably bonded, thereby improving the sealing performance.

With the LED display unit group according to the first embodiment of the present disclosure, n×m pixel units are encapsulated together to form a display unit group, thereby increasing the volume of the single display unit group and facilitating the welding operation; in addition, in a display unit group, the volume of the encapsulating material is increased, resulting in the more reliable bonding between the material and the insulating substrate, thereby improving the sealing performance; besides, with the above circuit structure, n+3m pins of the LED display unit group including n cathode pins and 3m anode pins are formed, such that a larger number of pins can be provided in a single display unit, resulting in the increased number of welding points contacting with the PCB, thereby improving the reliability of welding.

It should be noted that, in this embodiment, the A-electrode of the LED chip is a cathode and the B-electrode thereof is an anode for description. However, in the LED chip, the A-electrode may also be an anode and the B-electrode may be a cathode, which is not discussed again here. In the following embodiments of the present disclosure, the A-electrode of the LED chip is described as a cathode and the B-electrode thereof is described as an anode for explanation.

Optionally, each pixel unit includes a chip bonding pad, a common cathode pad, a first anode pad, a second anode pad, and a third anode pad.

The chip bonding pad is used for fixing the first LED chip, the second LED chip, and the third LED chip. The cathodes of the first LED chip, the second LED chip, and the third LED chip are connected to the common cathode pad. The anodes of the first LED chip, the second LED chip and the third LED chip are respectively connected to the first anode pad, the second anode pad and the third anode pad.

In the i-th row, the common cathode pads of the m pixel units are electrically connected together and are electrically connected to the i-th common cathode pin of the LED device.

In the j-th column, the first anode pads of the n pixel units are electrically connected together, and are electrically connected to the j-th first anode pin of the LED display unit group; the second anode pads of the n pixel units are electrically connected together, and are electrically connected to the j-th second anode pin of the LED display unit group; and the third anode pads of the n pixel units are electrically connected together, and are electrically connected to the j-th third anode pin of the LED display unit group.

The chip bonding pads, the common cathode pads, the first anode pads, the second anode pads, and the third anode pads are all formed on a front of an insulating substrate; and the n common cathode pins and 3m anode pins are both located on a back of the insulating substrate.

Figure 4:
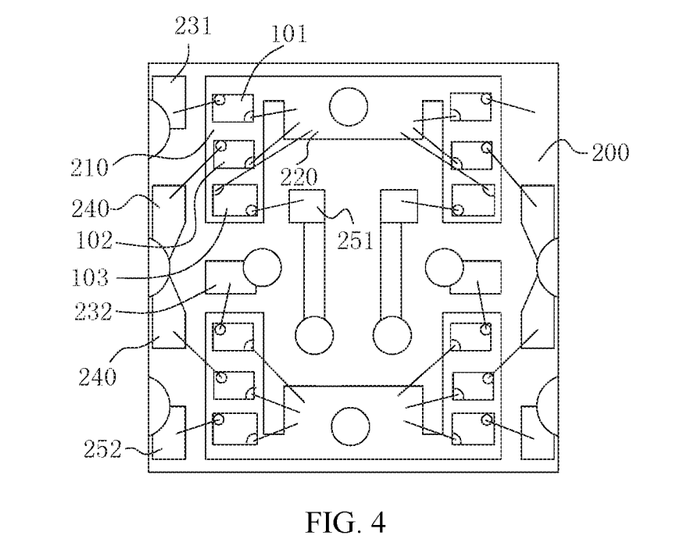
FIG. 4 is a front wiring diagram of the LED display unit group according to the first embodiment of the present disclosure.
Figure 5:
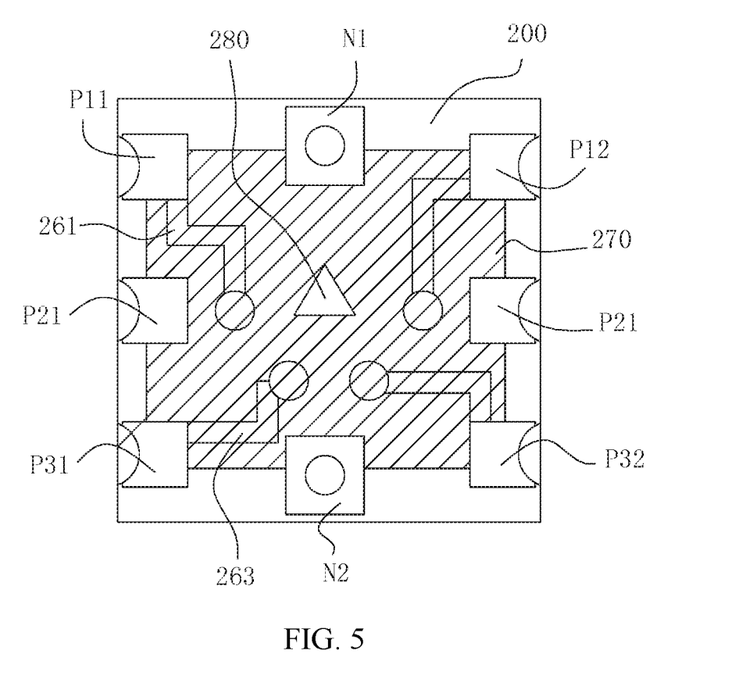
FIG. 5 is a rear wiring diagram of the LED display unit group in FIG. 4.

FIG. 4 is a front wiring diagram of an LED display unit group according to a first embodiment of the present disclosure, and FIG. 5 is a rear wiring diagram of the LED display unit group in FIG. 4. Referring to FIG. 4 and FIG. 5, based on the internal circuit structure of the LED display unit group as shown in FIG. 3, exemplarily n=2, m=2, and each pixel unit includes a chip bonding pad, a common cathode pad, a first anode pad, a second anode pad and a third anode pad. The arrangements of the LED chips in each pixel unit are the same, and the first LED chip, the second LED chip and the third LED chip are sequentially arranged from top to bottom. In each column of pixel units, the arrangements and locations of the chip bonding pad, common cathode pad and second anode pad of each pixel unit are the same, but the arrangements and locations of the first anode pad and the third anode pad thereof are different. In the present and following embodiments of the present disclosure, the same portions are denoted by the like reference numerals.

The common cathode pad, the first anode pad, the second anode pad, and the third anode pad are electrically connected to corresponding pins on the back of the insulating substrate through metal vias, or are electrically connected to the common cathode pin or the anode pins located on the insulating substrate through metal vias and metal traces located on the front and/or back of the insulating substrate.

In the same row of pixel units, the common cathode pads 220 of the two pixel units are electrically connected and are electrically connected to the first common cathode pin N1 of the LED device. Exemplarily, in the LED light-emitting unit group shown in FIG. 4, in the same row of pixel units, the common cathode pads 220 of the two pixel units are different parts of the same metal pad.

In the same column of pixel units, the chip bonding pad 210 of the pixel unit in the first row is used to fix the first LED chip 101, the second LED chip 102 and the third LED chip 103. The cathodes of the first LED chip 101, the second LED chip 102 and the third LED chip 103 are connected to the common cathode pad 220 corresponding to the pixel unit through leads. The anodes of the first LED chip 101, the second LED chip 102 and the third LED chip 103 are respectively connected to the first anode pad 231, the second anode pad 240 and the third anode pad 251 through leads. The chip bonding pad 210 of the pixel unit in the second row is used to fix the first LED chip 101, the second LED chip 102 and the third LED chip 103. The cathodes of the first LED chip 101, the second LED chip 102 and the third LED chip 103 are connected to the common cathode pad 220 corresponding to the pixel unit through leads. The anodes of the first LED chip 101, the second LED chip 102 and the third LED chip 103 are respectively connected to the first anode pad 232, the second anode pad 240 and the third anode pad 252 through leads.

In the same column of pixel units, the first anode pads 231 and 232 of the two pixel units are electrically connected together, and are electrically connected to the first first anode pin P11 of the LED display unit group. The second anode pads 240 of the two pixel units are electrically connected together, and are electrically connected to the first second anode pin P21 of the LED display unit group. The third anode pads 251 and 252 of the two pixel units are electri-cally connected together, and are electrically connected to the first third anode pin P31 of the LED display unit group.

Optionally, the chip bonding pad 210, the common cathode pad 220, the first anode pads 231 and 232, the second anode pad 240, and third anode pads 251 and 252 are all formed on the front of the insulating substrate 200. The two common cathode pins and the six anode pins are all located on the back of the insulating substrate 200.

It should be noted that, in the embodiment shown in FIG. 4, the LED chips are one-side-electrode LED chips. that is, the anode and the cathode thereof are located on the same side of the chip, and the non-electrode side of the LED chip is fixed on the chip bonding pad by the insulating adhesive. In other embodiments, the LED chip may also have other structures. The present disclosure will be described in the following embodiment.

Second Embodiment

Figure 6:
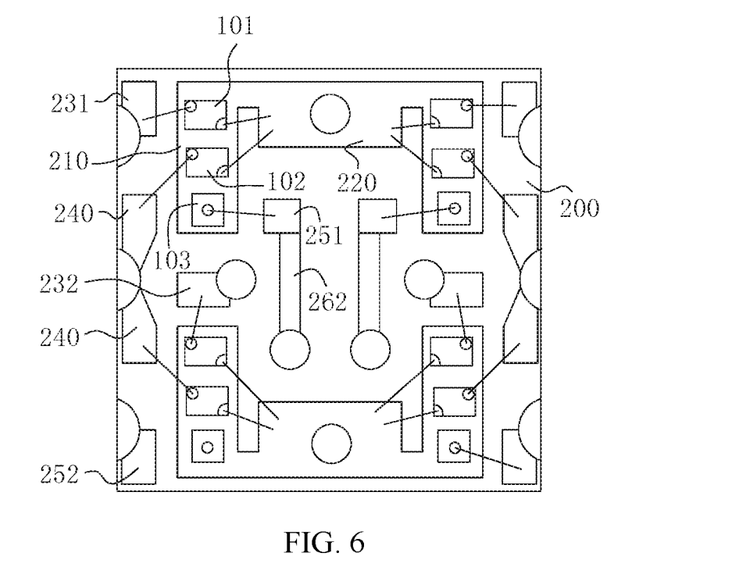
FIG. 6 is a front wiring diagram of an LED display unit group according to a second embodiment of the present disclosure.
Figure 7:
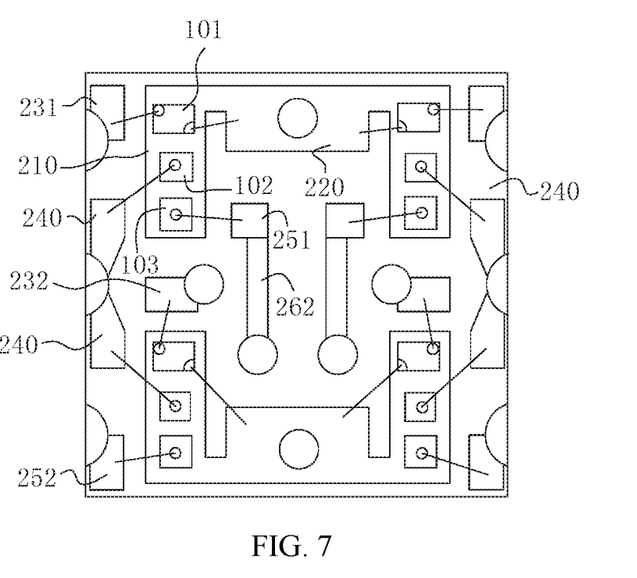
FIG. 7 is a front wiring diagram of another LED display unit group according to the second embodiment of the present disclosure.
Figure 8:
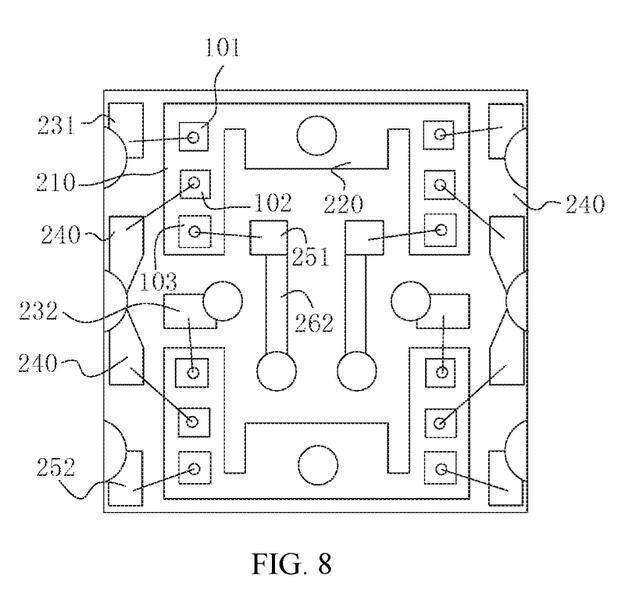
FIG. 8 is a front wiring diagram of yet another LED display unit group according to the second embodiment of the present disclosure.

A second embodiment of the present disclosure provides an LED display unit group, which is based on the technical scheme of the first embodiment of the present disclosure, where n=2 and m=2. FIG. 6 is a front wiring diagram of an LED display unit group according to a second embodiment of the present disclosure. FIG. 7 is a front wiring diagram of another LED display unit group according to the second embodiment of the present disclosure. FIG. 8 is a front wiring diagram of yet another LED display unit group according to the second embodiment of the present disclosure. Referring to FIG. 6, FIG. 7 and FIG. 8, on the basis of the first embodiment of the present disclosure, in the same row of pixel units, the common cathode pads 220 of two pixel units are different parts of the metal pad. The metal pad is directly connected to the common cathode pin corresponding to the row of the pixel units through a metal via. It should be noted that, in each row of the pixel units, the common cathode pads 220 of two pixel units may also be two metal pads connected by metal traces, and may be connected to the common cathode pin corresponding to the row of the pixel units at a specific position of the metal traces through the metal via. The wiring on the back of the LED display unit group shown in FIGS. 6, 7 and 8 may be the same as that of the LED display unit group shown in FIG. 5 in the first embodiment, which will not be described again herein.

Still referring to FIG. 6, FIG. 7 and FIG. 8, optionally, in the same row of the pixel units, the chip bonding pad 210 of two pixel units and the common cathode pad 220 of the two pixel units are different parts of the metal pad, or they are electrically connected by metal trace. Still referring to FIG. 6, the third LED chip 103 is a two-side-electrode chip. That is, the LED chip has an anode and a cathode, and the anode and the cathode are respectively located on the upper and lower sides of the LED chip. In this embodiment, the third LED chip is a two-side-electrode LED chip, in which the anode thereof is located at the upper side of the third LED chip, and the side with the cathode is in contact with the chip bonding pad 210. The cathode of the third LED chip 103 is fixed on the chip bonding pad 210 by a conductive adhesive. The first LED chip 101 and the second LED chip 102 are fixed on the chip bonding pad 210 through an insulating adhesive, wherein the conductive adhesive may be conductive silver paste. Still referring to FIG. 7, in the embodiment shown in FIG. 7, the second LED chip 102 and the third LED chip 103 are two-side-electrode LED chips, in which the anodes thereof are located at the upper side of the light-emitting chips, and the cathodes thereof are fixed on the chip bonding pad 210 through a conductive adhesive. Still referring to FIG. 8, in the embodiment shown in FIG. 8, all three LED chips are two-side-electrode LED chips, and the anodes thereof are located at the upper side of the light-emitting chip, and the cathodes of the three chips are fixed on the chip bonding pad 210 through a conductive adhesive.

Still referring to FIG. 5, FIG. 6, FIG. 7, and FIG. 8, optionally, in the same column of the pixel units, the first anode pad 231 of the pixel unit in the first row is directly connected to the first anode pad corresponding to the first anode pads 231 and 232 through a metal via; the first anode pad 232 of pixel unit in the second row extends to the back of the insulating substrate 200 through a metal via, and is connected to the anode pin corresponding to the first anode pads 231 and 232 through the first metal trace 261 located on the back of the insulating substrate 200;

Also, in the same column of the pixel units, the two second anode pads 240 are different parts of the metal pad, and the metal pad is directly connected to the anode pin corresponding to the second anode pad 240 through the metal via;

Also, in the same column of the pixel units, the third anode pad 252 of pixel unit in the second row is directly connected to the anode pin corresponding to the third anode pads 251 and 252 through the metal via, and the third anode pad 251 of pixel unit in the first row is connected to one end of the first front metal trace 262 on the front of the insulating substrate 200. The other end of the first front metal trace 262 extends to the back of the insulating substrate 200 through the metal via and is connected to the anode pin corresponding to the third anode pads 251 and 252 through the second back metal trace 263 located on the back of the insulating substrate 200.

Optionally, the LED chips having three different light colors are a red LED chip, a green LED chip, and a blue LED chip, respectively. In order to adapt to different trace requirements on the PCB, the first LED chip, the second LED chip, and the third LED chip may be red, green, and blue LED chips, respectively; and alternatively, may be blue, green and red LED chips, respectively. Other arrangements may also be possible, and the present disclosure is not limited thereto.

Optionally, still referring to FIG. 5, the two common cathode pins N1 and N2 are respectively located on opposite sides of the back of the insulating substrate 200 in the column direction, and the six anode pins are respectively located on opposite sides of the back of the insulating substrate 200 in the row direction. The three anode pins of the first column of pixel units and the three anode pins of the second column of pixel units are symmetrically arranged about the column bisector of pixel units (that is, the bisector in the column direction). The two common cathode pins are symmetrically arranged about the row bisector of the pixel units (that is, the bisector in the row direction).

Figure 9:
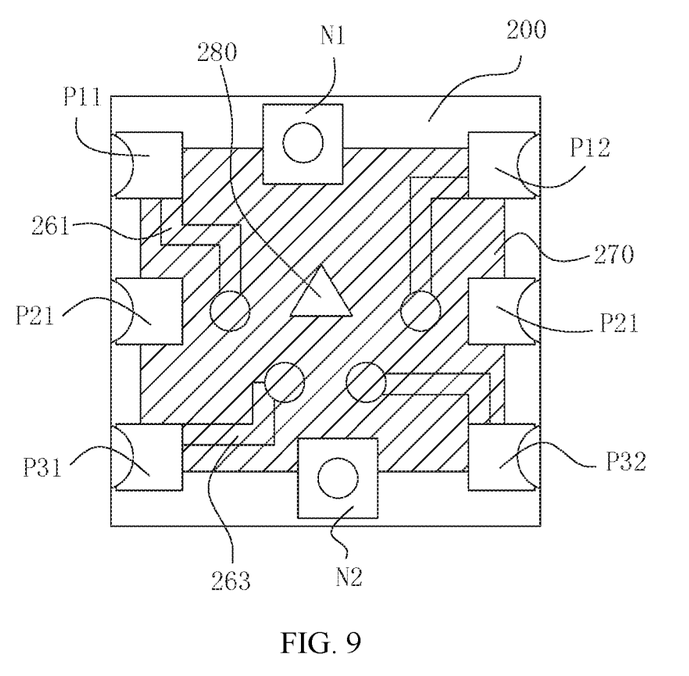
FIG. 9 is a rear wiring diagram of yet another LED display unit group according to the second embodiment of the present disclosure.

FIG. 9 is a rear wiring diagram of yet another LED display unit according to the second embodiment of the present disclosure. Optionally, the two common cathode pins N1 and N2 are respectively located on two sides of the bisector of the back of the insulating substrate 200 in the column direction. That is, the two common cathode pins are not symmetrically arranged about the row bisector of the pixel units. In the prior art, on PCB for welding LED display units, the traces connecting the common cathode pins are mostly travelled from the pins towards the direction away from the LED display unit. If there is a need to provide the traces from the pin to the LED display unit, then the traces corresponding to the two common cathode pins will cross and overlap with each other. Since the traces on the PCB board are bare lines, the traces corresponding to the two common cathode pins would have signal interference, or even cause a circuit failure. In this embodiment, the two common cathode pins are not symmetrically arranged with respect to the row bisector of the pixel units, so that there is no crossing and overlapping in the corresponding traces. It should be noted that, the rear wiring of the LED display unit group shown in FIG. 9 is also applicable to the LED display unit groups described in any one of first embodiment and second embodiment of the present disclosure.

Figure 10:
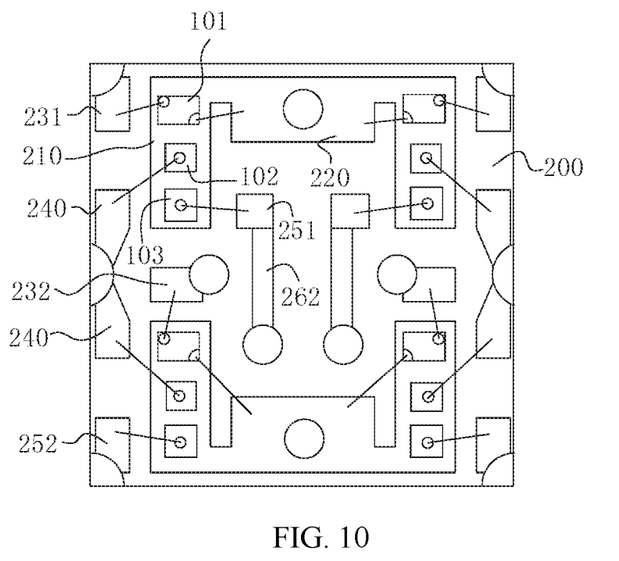
FIG. 10 is a front wiring diagram of yet another LED display unit group according to the second embodiment of the present disclosure.
Figure 11:
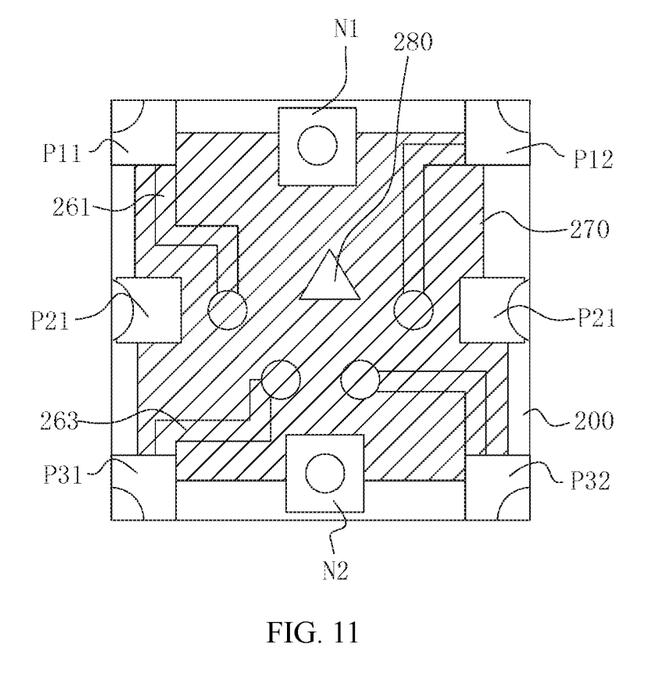
FIG. 11 is a rear wiring diagram of the LED display unit group in FIG. 10.

FIG. 10 is a front wiring diagram of yet another LED display unit group according to a second embodiment of the present disclosure. FIG. 11 is a rear wiring diagram of the LED display unit group shown in FIG. 10. A single LED display unit group is cut out from an array composed of multiple LED display unit groups. In the adjacent pixel units in adjacent LED light-emitting unit groups, the common cathode pads 220 and the chip bonding pads 210 share one metal pad, the first anode pads 231 share one metal pad, the second anode pads 240 share one metal pad, and the third anode pads 252 share one metal pad. In the adjacent pixel units in adjacent LED light-emitting unit groups, the first anode pins share one metal pad, the second anode pins share one metal pad, the third anode pins share one metal pad and the common cathode pins share one metal pad. For example, in an array composed of a plurality of LED display unit groups, it is possible that in the symmetrical center position of four adjacent LED display unit groups, the four adjacent LED display unit groups share a metal pin pad and a metal pad. The metal pin pad and metal pad are connected through a metal via. During cutting, the adjacent four LED display unit groups are cut separately horizontally and vertically, and the cross-section of the metal via connected to the first anode pin and the third anode pin of each display unit group is ¼ arc, and the arc is recessed from the outer towards interior of the LED display unit group, as shown in FIG. 11. The metal via is filled with the first insulating material. In order to meet different cutting needs and different welding area requirements when the LED display unit group and the PCB are welded, optionally, the cross-section of the metal vias connected to the first anode pin and the third anode pin are ½ arc, as shown in FIG. 5 and FIG. 9. The second anode pin is located between the first anode pin and the third anode pin, the cross-section of the metal via connected thereto is ½ arc, and the cross-sections of the metal vias connected to the two common cathode pins are a complete arc. The pin connected to the metal via with ¼ arc cross-section has a smaller welded area than the pin connected to the metal via with a ½-arc cross-section, but such arrangement can reduce the number of metal vias in the process of preparing the array of the LED display unit groups, thereby simplifying the preparation process. It should be noted that, the cross-section of the metal vias connected to the two common cathode pads may also be provided as ½ arc as cutting requirement, which will not be described here.

Figure 12:
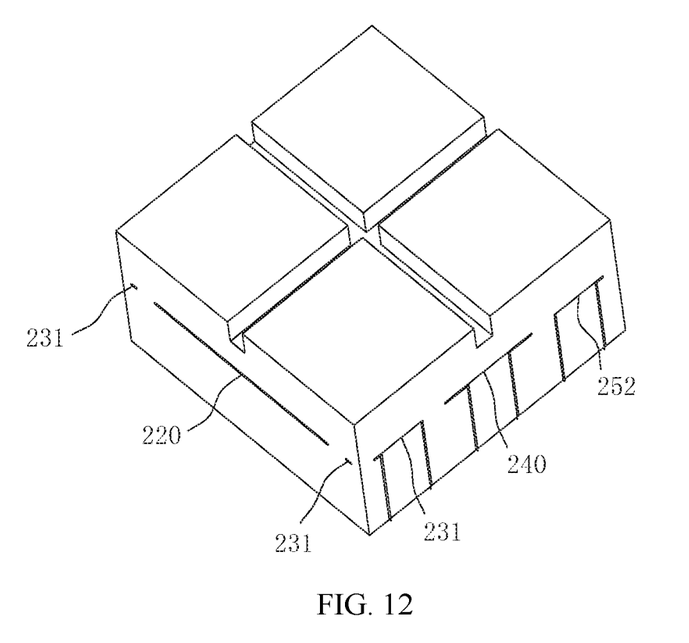
FIG. 12 is a schematic diagram of a structure of an LED light-emitting unit group according to the second embodiment of the present disclosure.

FIG. 12 is a schematic diagram of a three-dimensional structure of an LED light-emitting unit group according to a second embodiment of the present disclosure. As described above, a single LED display unit group is cut out from an array including a plurality of LED display unit groups. In the adjacent pixel units in adjacent LED light-emitting unit groups, the common cathode pads 220 and the chip bonding pads 210 share one metal pad, the first anode pads 231 share one metal pad, the second anode pads 240 share one metal pad, and the third anode pads 252 share one metal pad. When cutting, The metal pads used by the chip bonding pad 210, the common cathode pad 220, the first anode pad 231, the second anode pad 240 and the third anode pad 252 are all cut, so that on the cut surface (the side of the LED display unit group), the chip bonding pad 210, the common cathode pad 220, the first anode pad 231, the second anode pad 240, and the third anode pad 252 of the pixel unit located at the outermost position are all exposed through a sidewall of the LED display unit group, as shown in FIG. 12.

Still referring to FIG. 12, optionally, the metal via is filled with a first insulating material. The first insulating material includes a resin (a vinyl ester resin commonly used in PCB industries) or green oil, and the first insulating material does not extend beyond the upper and lower surfaces of the insulating substrate. The advantages for such the filling are that when the subsequent device is encapsulated, the bonding force between the encapsulating material and the insulating substrate 200 is reinforced, thereby improving the sealing performance.

Still referring to FIG. 5, FIG. 9 and FIG. 11, optionally, the back of the insulating substrate 200 is provided with a second insulating material 270. As shown by hatched portions in FIGS. 5 and 9, the second insulating material 270 covers the back metal trace of the back of the insulating substrate 200. The second insulating material 270 includes white oil, resin or green oil, etc., and has insulation and protection functions.

Still referring to FIG. 5, FIG. 9 and FIG. 11, optionally, the back of the insulating substrate 200 is provided with an identification mark 280 for identifying the polarity of the pin. In this embodiment, the identification mark 280 is the insulating substrate 200 itself, and the surface of the identification mark is not covered by the second insulating material 270, but the periphery of the identification mark is covered by the second insulating material 270. The identification mark is formed due to different colors of the insulating substrate 200 from second insulating material 270.

Still referring to FIG. 12, optionally, cutting grooves are included between two adjacent rows of pixel units and between two adjacent columns of pixel units. A single LED display unit group is cut out from an array including a plurality of LED display unit groups. According to actual application requirements, an LED display unit group having n rows and m columns of pixel units is formed by cutting. Therefore, the cutting groove are included between two adjacent rows of pixel units and two adjacent columns of pixel units, so that cutting along the cutting groove can form an LED display unit group including any number of rows and any number of columns of pixel units, thereby simplifying and the process and improving the process precision. In addition, adjacent pixel unit groups are separated by the cutting groove to avoid the phenomenon of crosstalk between the adjacent pixel units.

Third Embodiment

Figure 13:
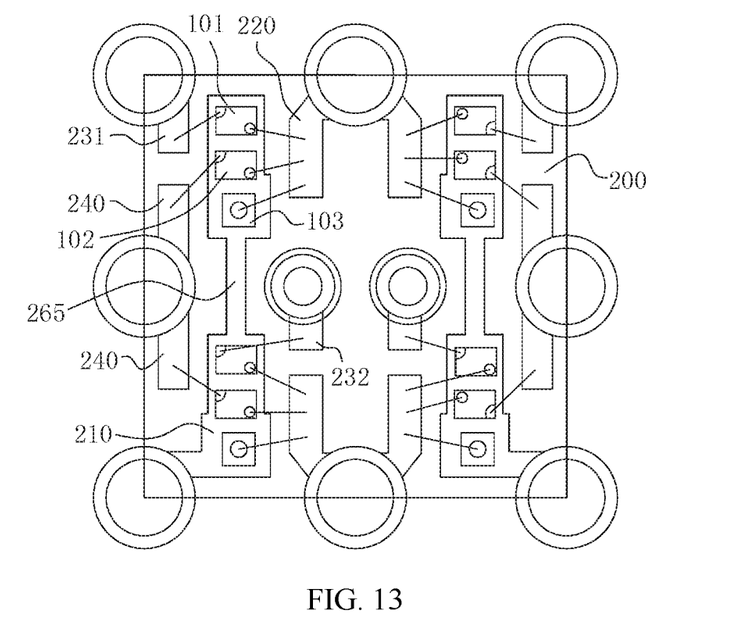
FIG. 13 is a front wiring diagram of an LED display unit group according to a third embodiment of the present disclosure.
Figure 14:
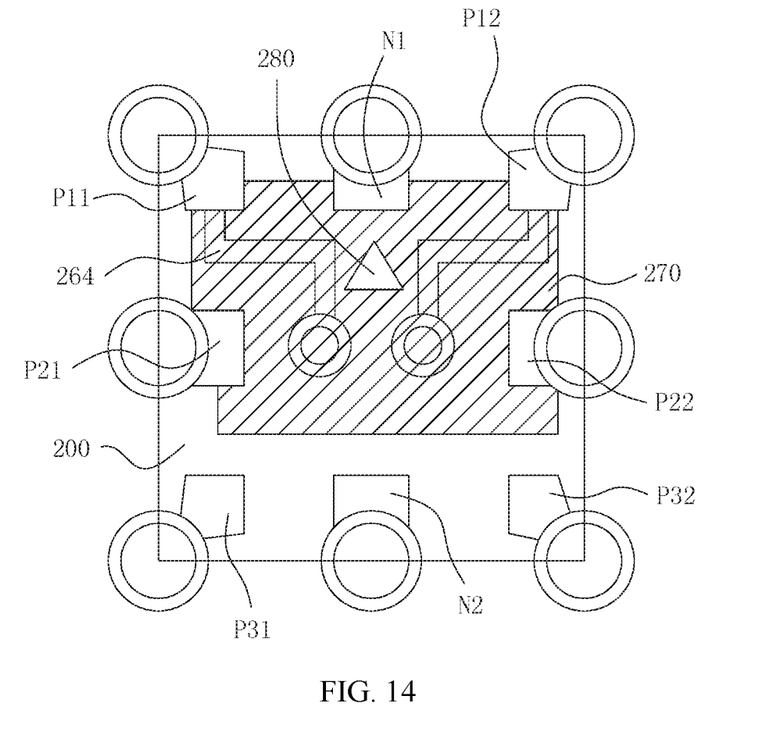
FIG. 14 is a rear wiring diagram of the LED display unit group in FIG. 13.

A third embodiment of the present disclosure provides an LED display unit group, which is based on the technical scheme of the first embodiment of the present disclosure, where n=2 and m=2. FIG. 13 is a front wiring diagram of an LED display unit group according to a third embodiment of the present disclosure, and FIG. 14 is a rear wiring diagram of the LED display unit group in FIG. 13. Referring to FIG. 13 and FIG. 14, optionally, the pixel unit in the first row and first column is taken as an example, the third LED chip 103 is a two-side-electrode chip, that is, the LED chip has an anode and a cathode, and the anode and the cathode are respectively located on the upper and lower sides of the LED chip. In this embodiment, the third LED chip is a two-side-electrode LED chip, and the anode of the light-emitting chip is located at the lower side of the third LED chip. That is, the side having the anode is in contact with the chip bonding pad 210. The anode of the third LED chip 103 is fixed on the chip bonding pad 210 by the conductive adhesive, and the first LED chip 101 and the second LED chip 102 are fixed on the chip bonding pad 210 by the insulating adhesive. The chip bonding pad 210 of the pixel unit also serves as the anode pad (i.e., the third anode pad) of the third LED chip in the pixel unit. Similarly, two of three LED chips may be two-side-electrode LED chips, the anode of the light-emitting chip is located at lower side of the third LED chip, and the other of the three LED chips is a one-side-electrode chip, where the one-side-electrode chip has an anode and a cathode, and both the anode and the cathode are located upper side of the LED chip. Alternatively, the three LED chips are all inverted-electrode LED chips, where the anode of the light-emitting chip is located at the lower side of the third LED chip, which will not be described here. The three LED chips having different light-emitting colors are a red LED chip, a green LED chip, and a blue LED chip, respectively. In order to adapt to different trace requirements on the PCB, the first LED chip, the second LED chip, and the third LED chip may be a red LED chip, a green LED chip, and a blue LED chip, respectively; or, may be a blue LED chip, a green LED chip, and a red LED chip, respectively. Other arrangements may also be possible, and the present disclosure is not limited thereto.

Still referring to FIG. 13, optionally, in the same row of pixel units, the common cathode pads 220 of two pixel units are different parts of the same metal pad, and the metal pad is directly connected to the common cathode pin corresponding to the row of pixel units through the metal via. Alternatively, the common cathode pads 220 of two pixel units are connected together through the metal trace, and the metal trace is directly connected to the common cathode pin corresponding to the row of pixel units through the metal via.

In the same column of pixel units, the first anode pad 231 of the pixel unit in the first row is directly connected to the anode pin corresponding to the first anode pads 231 and 232 through the metal via, and the first anode pad 232 of the pixel unit in the second row is connected to the back of the insulating substrate 200 through the metal via, and is connected to the anode pin corresponding to the first anode pads 231 and 232 through the third back metal trace 264 located on the back of the insulating substrate 200.

The two second anode pads 240 are different parts of the same metal pad, and the metal pad is directly connected to the anode pin corresponding to the second anode pad 240 through the metal via.

The third anode pad (i.e., the chip bonding pad 210) in the second row of pixel units is directly connected to the anode pin corresponding to the third anode pad through the metal via, and the two third anode pads (i.e., the chip bonding pad 210) is connected together through a second front metal trace 265 located on the front of the insulating substrate 200. In each pixel unit, the chip bonding pad 210 simultaneously serves as the third anode pads of the three LED chips.

In the LED light-emitting unit group in this embodiment, a two-side-electrode LED chip is used, where the anode of the light-emitting chip is located at the lower side of the third LED chip, and the chip bonding pad also serves as the anode pad of one of the LED chips. The anode pad is connected thereto through the second front metal trace 265 on the front of the insulating substrate. Therefore, there is no need to provide a metal via to connect the two anode pads, which simplifies the manufacturing process.

Optionally, still referring to FIG. 14, the two common cathode pins N1 and N2 are respectively located on opposite sides of the back of the insulating substrate 200 in the column direction, and the six anode pins are respectively located on opposite sides of the back of the insulating substrate 200 in the row direction. The three anode pins of the first column of pixel units and the three anode pins of the second column of pixel units are symmetrically arranged about the column bisector of pixel units. The two common cathode pins are symmetrically arranged about the row bisector of the pixel units. Alternatively, in other embodiments, the two common cathode pins N1 and N2 are respectively located on two sides of the bisector of back of the insulating substrate 200 in the column direction. That is, the two common cathode pins are not symmetrically arranged about the row bisector of the pixel units. The first anode pin and the third anode pin are located on top corners at the back of the insulating substrate, a cross-section of the metal via connected to the first anode pin and the third anode pin is ½ arc or ¼ arc. The second anode pin is located between the first anode pin and the third anode pin, the cross-section of the metal via connected thereto is ½ arc, and the cross-sections of the metal vias connected to the two common cathode pins are a complete arc. The pin connected to the metal via with ¼ arc cross-section has a smaller welded area than the pin connected to the metal via with a ½-arc cross-section, but such arrangement can reduce the number of metal vias in the process of preparing the array of the LED display unit groups, thereby simplifying the preparation process. It should be noted that, the cross-section of the metal vias connected to the two common cathode pads may also be provided as ½ arc as cutting requirement, which will not be described here.

Optionally, the metal via is filled with a first insulating material. The first insulating material includes a resin or green oil, and the first insulating material does not extend beyond the upper and lower surfaces of the insulating substrate. The advantages for such the filling are that when the subsequent device is encapsulated, the bonding force between the encapsulating material and the insulating substrate 200 is reinforced, thereby improving the sealing performance.

The back of the insulating substrate 200 is provided with a second insulating material 270. The second insulating material 270 covers the back metal trace of the back of the insulating substrate 200. The second insulating material 270 includes white oil, resin or green oil, etc., and has insulation and protection functions.

Still referring to FIG. 14, optionally, the back of the insulating substrate 200 is provided with an identification mark 280 for identifying the polarity of the pin. In this embodiment, the identification mark 280 is the insulating substrate 200 itself, and the surface of the identification mark is not covered by the second insulating material 270, but the periphery of the identification mark is covered by the second insulating material 270. The identification mark is formed due to different colors of the insulating substrate 200 from second insulating material 270.

On the cut surface (the side of the LED display unit group), the chip bonding pad 210, the common cathode pad 220, the first anode pad 231, the second anode pad 240, and the third anode pad 252 are all exposed through a sidewall of the LED display unit group.

Optionally, cutting grooves are included between two adjacent rows of pixel units and between two adjacent columns of pixel units. A single LED display unit group is cut out from an array including a plurality of LED display unit groups. According to actual application requirements, an LED display unit group having n rows and m columns of pixel units is formed by cutting. Therefore, the cutting groove are included between two adjacent rows of pixel units and two adjacent columns of pixel units, so that cutting along the cutting groove can form an LED display unit group including any number of rows and any number of columns of pixel units, thereby simplifying and the process and improving the process precision. In addition, adjacent pixel unit groups are separated by the cutting groove to avoid the phenomenon of crosstalk between the adjacent pixel units.

It should be noted that, in the above embodiments of the present disclosure, exemplarily, the A-electrode of the LED chip is a cathode, and the B-electrode thereof is an anode for description. However, the A-electrode of the LED chip may also be an anode, and the B-electrode thereof may also be a cathode for description, which will not be discussed again here.

Fourth Embodiment

A fourth embodiment of the present disclosure provides a display panel, which includes the LED display unit group described in any of above first to third embodiments.

Note that the above is merely embodiments of the present disclosure and applied technical principles. Those skilled in the art will understand that the present disclosure is not limited to the specific embodiments described herein, and various changes, readjustments, and substitutions can be made by those skilled in the art without departing from the scope of the present disclosure. Therefore, although the present disclosure is described in detail through the above embodiments, the present disclosure is not limited to the above embodiments, and other equivalent embodiments may also be included without departing from the concept of the present disclosure. The scope of the disclosure is determined by the appended claims.

What is claimed is:

1. An LED display unit group, comprising a pixel unit array comprising n rows and m columns of pixel units, wherein both n and m are positive integers greater than or equal to 2;
    wherein, each of the pixel units comprises three LED chips having different light-emitting colors, which are respectively a first LED chip, a second LED chip and a third LED chip; and each of the LED chips comprises an A-electrode and a B-electrode, wherein polarities of the A-electrode and B-electrode are opposite to each other;
    in the i-th row of pixel units, the A-electrodes of all the LED chips in m pixel units are connected together, and are electrically connected to the i-th common A-electrode pin of the LED display unit group;
    in the j-th column of pixel units,
        the B-electrodes of n first LED chips are connected together, and are electrically connected to the j-th first B-electrode pin of the LED display unit group;
        the B-electrodes of n second LED chips are connected together, and are electrically connected to the j-th second B-electrode pin of the LED display unit group; and the B-electrodes of n third LED chips are connected together, and are electrically connected to j-th third B-electrode pin of the LED display unit group; and
wherein 1≤i≤n, 1≤j≤m, and i, j are both integers;
wherein, each of the pixel units comprises a chip bonding pad, a common A-electrode pad, a first B-electrode pad, a second B-electrode pad and a third B-electrode pad;
the chip bonding pad is used to fix the first LED chip, the second LED chip, and the third LED chip;
the A-electrodes of the first LED chip, the second LED chip, and the third LED chip are connected to the common A-electrode pad, and
the B-electrodes of the first LED chip, the second LED chip, and the third LED chip are respectively connected to the first B-electrode pad, the second B-electrode pad and the third B-electrode pad;
in the i-th row of pixel units, the common A-electrode pads of the m pixel units are electrically connected together, and are electrically connected to the i-th common A-electrode pin of the LED device;
in the j-th column of pixel units,
the first B-electrode pads of the n pixel units are electrically connected together, and are electrically connected to the j-th first B-electrode pin of the LED display unit group;
the second B-electrode pads of the n pixel units are electrically connected together, and are electrically connected to the j-th second B-electrode pin of the LED display unit group; and
the third B-electrode pads of the n pixel units are electrically connected together, and are electrically connected to the j-th third B-electrode pin of the LED display unit group; and
the chip bonding pads, the common A-electrode pads, the first B-electrode pads, the second B-electrode pads, and the third B-electrode pads are formed on a front of an insulating substrate; and the n common A-electrode pins and 3m B-electrode pins are located on a back of the insulating substrate;
wherein, in each of the pixel units, at least one LED chip is a two-side-electrode LED chip, wherein the A-electrode and the B-electrode of the LED chip are located on the upper and lower sides of the LED chip, respectively.

2. The LED display unit group according to claim 1, wherein
the n=2 and the m=2, and
the common A-electrode pad, the first B-electrode pad, the second B-electrode pad, and the third B-electrode pad are electrically connected to the corresponding pins located at the back of the insulating substrate through metal vias, or are electrically connected to one of the common A-electrode pin and the B-electrode pins located at the insulating substrate through the metal vias and metal traces located at least one of the front and the back of the insulating substrate.

3. The LED display unit group according to claim 2, wherein
in each row of the pixel units, the common A-electrode pads of two pixel units are different parts of a metal pad, and the metal pad is directly connected to the common A-electrode pin corresponding to the row of the pixel unit through the metal via.

4. The LED display unit group according to claim 3, wherein
in each of the pixel units, the chip bonding pad is electrically connected to the common A-electrode pad.

5. The LED display unit group according to claim 2, wherein
the first B-electrode pin and the third B-electrode pin are located on top corners at the back of the insulating substrate, a cross-section of the metal via connected to the first B-electrode pin and the third B-electrode pin is one of ½ arc and ¼ arc, where the arc is recessed from outside to the inside of the LED display unit group, and the metal via is filled with a first insulating material.

6. The LED display unit group according to claim 5, wherein
the first insulating material comprises one of a resin and a green oil, and the first insulating material does not exceed the upper and lower surfaces of the insulating substrate.

7. The LED display unit group according to claim 1, wherein
the third LED chip is a two-side-electrode LED chip, and the B-electrode of the two-side-electrode LED chip is located at the upper side of the LED chip, and the chip bonding pads of two pixel units in the same row of the pixel units and the common A-electrode pad of the two pixel units are different parts of the metal pad.

8. The LED display unit group according to claim 7, wherein in the same column of the pixel units:
the first B-electrode pad of the pixel unit in the first row is directly connected to the first B-electrode pin corresponding to the first B-electrode pad through the metal via, and the first B-electrode pad located of the pixel unit in the second row is extended to the back of the insulating substrate through the metal via, and is connected to the B-electrode pin corresponding to the first B-electrode pad through a first back metal trace located at the back of the insulating substrate;
the two second B-electrode pads are different parts of the metal pad, and the metal pad is directly connected to the B-electrode pin corresponding to the second B-electrode pad through the metal via; and
the third B-electrode pad of pixel unit in the second row is directly connected to the third B-electrode pin corresponding to the third B-electrode pad through the metal via, the third B-electrode pad of pixel unit in the first row is connected to one end of a first front metal trace located on the front of the insulating substrate, and the other end of the first front metal trace is extended to the back of the insulating substrate through the metal via, and is connected to the B-electrode pin corresponding to the third B-electrode pad through the second back metal trace located on the back of the insulating substrate.

9. The LED display unit group according to claim 1, wherein
the third LED chip is a two-side-electrode LED chip, and the B-electrode of the two-side-electrode LED chip is located at the lower side of the LED chip, the B-electrode of the third LED chip is fixed on the chip bonding pad by a conductive adhesive, and the first LED chip and the second LED chip are fixed on the chip bonding pad by an insulating adhesive.

10. The LED display unit group according to claim 9, wherein in the same column of pixel units:
the first B-electrode pad of the pixel unit in the first row is directly connected to a B-electrode pin corresponding to the first B-electrode pad through the metal via, and the first B-electrode pad of the pixel unit in the second row is connected to a back side of the insulating substrate through the metal via, and is connected to the B-electrode pin corresponding to the first B-electrode pad via a third back metal trace located at the back of the insulating substrate;

the two second B-electrode pads are different parts of the metal pad, and the metal pad is directly connected to the B-electrode pin corresponding to the second B-electrode pad through the metal via; and the third B-electrode pad of the pixel unit in the second row is directly connected to the B-electrode pin corresponding to the third B-electrode pad through the metal via, and the two third B-electrode pads are connected through second front metal trace located at the front of the insulating substrate.

11. The LED display unit group according to claim 1, wherein the LED chips having three different light-emitting colors are a red LED chip, a green LED chip, and a blue LED chip, respectively.

12. The LED display unit group according to claim 1, wherein the n=2 and the m=2, and two common A-electrode pins and six B-electrode pins are provided, wherein the two common A-electrode pins are respectively located on two opposite sides at the back of the insulating substrate in a column direction, the six B-electrode pins are respectively located on two opposite sides at the back of the insulating substrate in a row direction.

13. The LED display unit group according to claim 12, wherein the two common A-electrode pins are on both sides of a bisector in the column direction at the back of the insulating substrate.

14. The LED display unit group according to claim 12, wherein the back of the insulating substrate is provided with a second insulating material, and the second insulating material covers a back metal trace located at the back of the insulating substrate.

15. The LED display unit group according to claim 14, wherein

The back of the insulating substrate is provided with an identification mark for identifying the polarities of the pins.

16. The LED display unit group according to claim 1, wherein a cutting groove is comprised between two adjacent rows of the pixel units and between two adjacent columns of the pixel units.

17. The LED display unit group according to claim 1, wherein the chip bonding pad, the common A-electrode pad, the first B-electrode pad, the second B-electrode pad, and the third B-electrode pad of the pixel unit at the outermost position are all exposed through a sidewall of the LED display unit group.

18. A display panel, comprising the LED display unit group according to claim 1.

* * * * *